(12) United States Patent

Ishii et al.

(10) Patent No.: US 8,514,612 B2
(45) Date of Patent: Aug. 20, 2013

(54) SEMICONDUCTOR MEMORY DEVICE

(75) Inventors: Yuichiro Ishii, Kanagawa (JP); Atsushi Miyanishi, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 165 days.

(21) Appl. No.: 13/116,642

(22) Filed: May 26, 2011

(65) Prior Publication Data

US 2011/0305072 A1 Dec. 15, 2011

(30) Foreign Application Priority Data

Jun. 9, 2010 (JP) ................................ 2010-132109

(51) Int. Cl.
*G11C 11/00* (2006.01)
(52) U.S. Cl.
USPC .......................................................... 365/154
(58) Field of Classification Search
USPC .......................................................... 365/154
See application file for complete search history.

(56) References Cited

U.S. PATENT DOCUMENTS 5,335,199 A 8/1994 Aoyama
6,674,676 B1 * 1/2004 Hsu et al. ....................... 365/200

FOREIGN PATENT DOCUMENTS

JP 05-109279 4/1993

* cited by examiner

*Primary Examiner* — Anthan Tran
(74) *Attorney, Agent, or Firm* — McDermott Will & Emery LLP

(57) ABSTRACT

A semiconductor memory device is provided in which erroneous writing to a dual port memory cell can be prevented without short-circuiting bit lines coupled to two ports. The first write driver applies voltage corresponding to the first write data to the first bit line, when activated. The first write assist driver applies voltage corresponding to the first write data to the second bit line, when activated. A row of the memory cell array for the first access through the first port is specified by the first row address, and a row of the memory cell array for the second access through the second port is specified by the second row address. The first write assist driver is activated at least on condition that the first write driver is activated and that the first row address and the second row address coincide.

8 Claims, 5 Drawing Sheets

SEMICONDUCTOR MEMORY DEVICE

CROSS-REFERENCE TO RELATED APPLICATIONS

The disclosure of Japanese Patent Application No. 2010-132109 filed on Jun. 9, 2010 including the specification, drawings and abstract is incorporated herein by reference in its entirety.

BACKGROUND

The present invention relates to a semiconductor memory device, especially to a semiconductor memory device which comprises a dual port memory cell.

In a semiconductor memory device which comprises a dual port memory cell, when a read or a write is performed from one port of a certain memory cell and subsequently a write is performed from the other port of the memory cell at the same address or in the same row of the layout, the subsequent write is affected by the previous read or the previous write; accordingly, the subsequent write may result in error.

Patent Document 1 (Japanese Patent Laid-open No. Hei 5 (1993)-109279) discloses the following technology to cope with such a problem. That is, Patent Document 1 discloses the technology in which, when plural word lines belonging to the same row are selected from plural ports for a read or a write, a short circuit is employed to short substantially a bit line corresponding to a port selected for the write among bit lines corresponding to the plural selected ports and another arbitrary selected bit line. Patent Document 1 describes that, by adopting such a configuration, the problem of an erroneous writing to a cell at the time of selecting the same row from plural ports is solved.

(Patent Document 1) Japanese Patent Laid-open No. Hei 5 (1993)-109279

SUMMARY

However, in the device disclosed by Patent Document 1, bit line capacity seen from a write driver will differ when accessing the same row and when accessing a different row. Since both ports operate asynchronously, bit line capacity seen from the write driver changes depending on skew conditions of a clock. In order to keep pace with such changes of bit line capacity, it is difficult to avoid the complicated circuit design.

Since a bit line of the other side is driven through another stage of a transistor when seen from the write driver, low voltage characteristics get worse.

An address comparison circuit of the device concerned is used by a clock-asynchronous dual-port SRAM (Static Random Access Memory) and cannot be applied directly to a clock-synchronous dual-port SRAM which is a mainstream currently.

The present invention has been made in view of the above circumstances and provides a semiconductor memory device which can prevent an erroneous writing, without short-circuiting two bit lines coupled to two ports of a dual port memory cell.

A semiconductor memory device according to one embodiment of the present invention comprises: a memory cell array with plural memory cells arranged in a matrix and each having a first port and a second port; a first bit line coupled to the first port; a second bit line coupled to the second port; a first write driver which is able to apply voltage corresponding to a first write data to the first bit line when activated; and a first write assist driver which is able to apply voltage corresponding to the first write data to the second bit line when activated. A row of the memory cell array for first access is specified by a first row address through the first port. A row of the memory cell array for second access is specified by a second row address through the second port. The first write assist driver is activated at least on condition that the first write driver is activated and that the first row address is coincident with the second row address.

According to one embodiment of the present invention, erroneous writing to a dual port memory cell can be prevented without short-circuiting bit lines coupled to two ports.

DETAILED DESCRIPTION

Hereinafter, with reference to the accompanying drawings, the embodiment of the present invention is explained.

(Configuration of a Semiconductor Memory Device)

Figure 1:
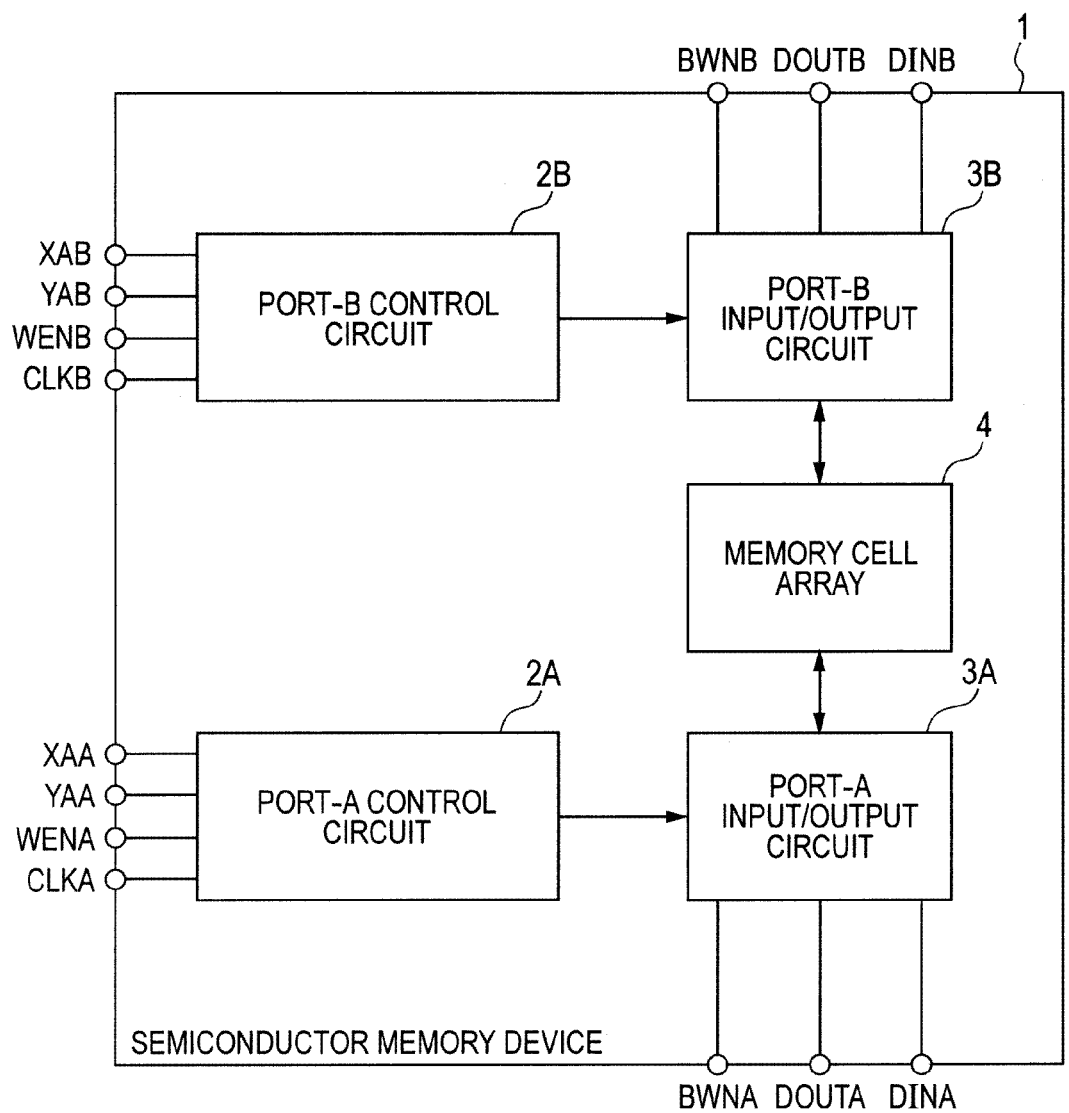
FIG. 1 is a drawing illustrating a configuration of a semiconductor memory device according to an embodiment of the present invention.

FIG. 1 illustrates a configuration of a semiconductor memory device according to an embodiment of the present invention.

As illustrated in FIG. 1, the semiconductor memory device 1 comprises a memory cell array 4, a port-A control circuit 2A, a port-A input/output circuit 3A, a port-B control circuit 2B, and a port-B input/output circuit 3B.

In the memory cell array 4, plural SRAM cells each having dual ports are arranged in a matrix.

The port-A control circuit 2A and the port-A input/output circuit 3A control access through the port A of an SRAM of the memory cell array 4.

The port-A control circuit 2A receives a row address signal XAA, a column address signal YAA, a read/write specification signal WENA, and a clock signal CLKA, from the exterior.

The row address signal XAA specifies a row in the memory cell array 4 as a target of the access through the port A. The column address signal YAA specifies a column in the memory cell array 4 as a target of the access through the port A.

The read/write specification signal WENA specifies whether access through the port A is a read or a write.

The clock signal CLKA controls timing of access through the port A.

The port-A input/output circuit 3A receives write data DINA and a bit write mask signal BWNA from the exterior and outputs read data DOUTA to the exterior.

The write data DINA is written in a corresponding memory cell when access through the port A is a write.

The read data DOUTA is read from a corresponding memory cell when access through the port A is a read.

The bit write mask signal BWNA specifies existence or nonexistence of a write mask for every column in access through the port A.

The port-B control circuit 2B and the port-B input/output circuit 3B control access through the port B of an SRAM of the memory cell array 4.

The port-B control circuit 2B receives a row address signal XAB, a column address signal YAB, a read/write specification signal WENB, and a clock signal CLKB, from the exterior.

The row address signal XAB specifies a row in the memory cell array 4 as a target of the access through the port B. The column address signal YAB specifies a column in the memory cell array 4 as a target of the access through the port B.

The read/write specification signal WENB specifies whether access through the port B is a read or a write.

The clock signal CLKB controls timing of access through the port B.

The port-B input/output circuit 3B receives write data DINB and a bit write mask signal BWNB from the exterior and outputs read data DOUTB to the exterior.

The write data DINB is written in a corresponding memory cell when access through the port B is a write.

The read data DOUTB is read from a corresponding memory cell when access through the port B is a read.

The bit write mask signal BWNB specifies existence or nonexistence of a write mask for every column in access through the port B.

(Configuration of a Memory Cell)

Figure 2:
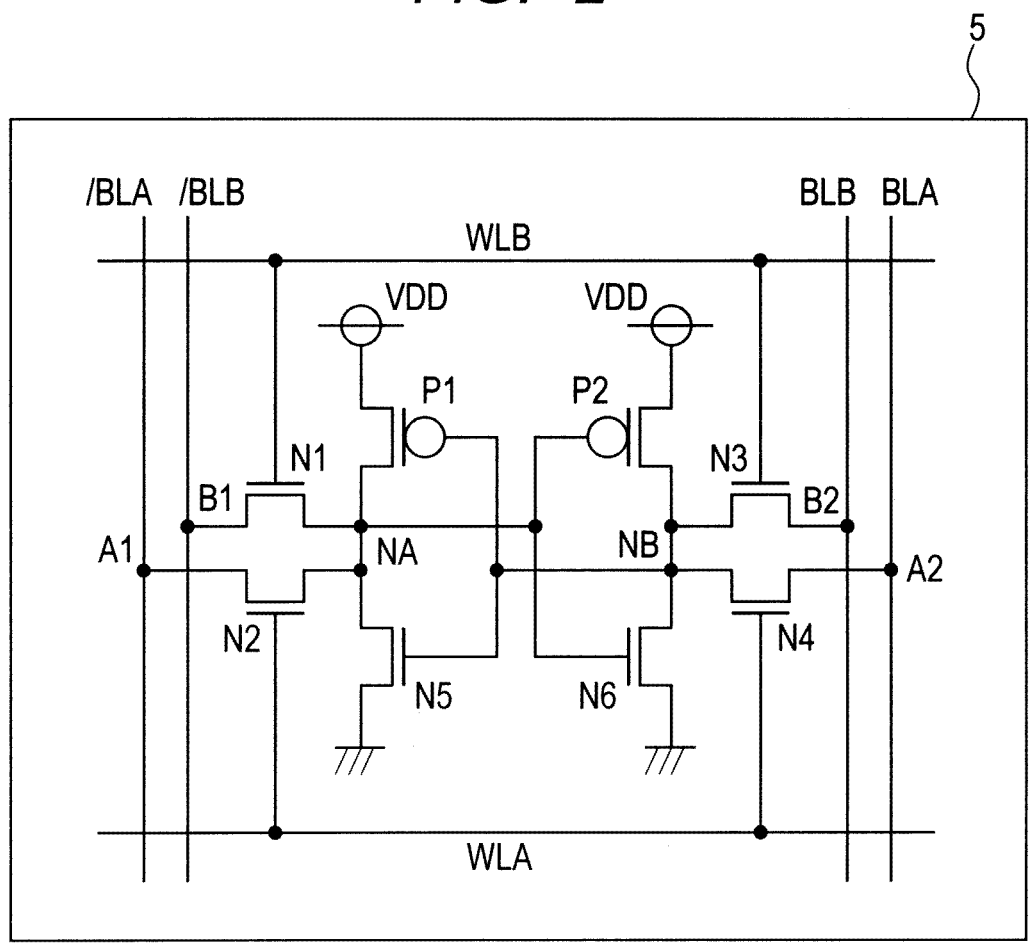
FIG. 2 is a drawing illustrating a configuration of an SRAM cell included in a memory cell array illustrated in FIG. 1.

FIG. 2 illustrates a configuration of an SRAM cell included in a memory cell array illustrated in FIG. 1.

As illustrated in FIG. 2, the SRAM cell comprises P-channel MOS transistors P1 and P2, and N-channel MOS transistors N1, N2, N3, N4, N5, and N6.

The P-channel MOS transistor P1 is coupled between a power node VDD and a memory node NA, and its gate is coupled to a memory node NB. The N-channel MOS transistor N5 is coupled between the memory node NA and a ground node VSS, and its gate is coupled to the memory node NB. The P-channel MOS transistor P1 and the N-channel MOS transistor N5 configure a first CMOS inverter.

The P-channel MOS transistor P2 is coupled between the power node VDD and the memory node NB, and its gate is coupled to the memory node NA. The N-channel MOS transistor N6 is coupled between the memory node NB and the ground node VSS, and its gate is coupled to the memory node NA. The P-channel MOS transistor P2 and the N-channel MOS transistor N6 configure a second CMOS inverter.

The memory node NB which serves as an input of the first CMOS inverter and an output of the second CMOS inverter are coupled with each other. The memory node NA which serves as an input of the second CMOS inverter and an output of the first CMOS inverter are coupled with each other.

The N-channel MOS transistor N2 is coupled between the memory node NA and a port A1, and its gate is coupled to a word line WLA. The port A1 is coupled to a bit line /BLA.

The N-channel MOS transistor N1 is coupled between the memory node NA and a port B1, and its gate is coupled to a word line WLB. The port B1 is coupled to a bit line /BLB.

The N-channel MOS transistor N4 is coupled between the memory node NB and a port A2, and its gate is coupled to the word line WLA. The port A2 is coupled to a bit line BLA.

The N-channel MOS transistor N3 is coupled between the memory node NB and a port B2, and its gate is coupled to the word line WLB. The port B2 is coupled to a bit line BLB.

(The Port-A Control Circuit and the Port a Input/Output Circuit)

Figure 3:
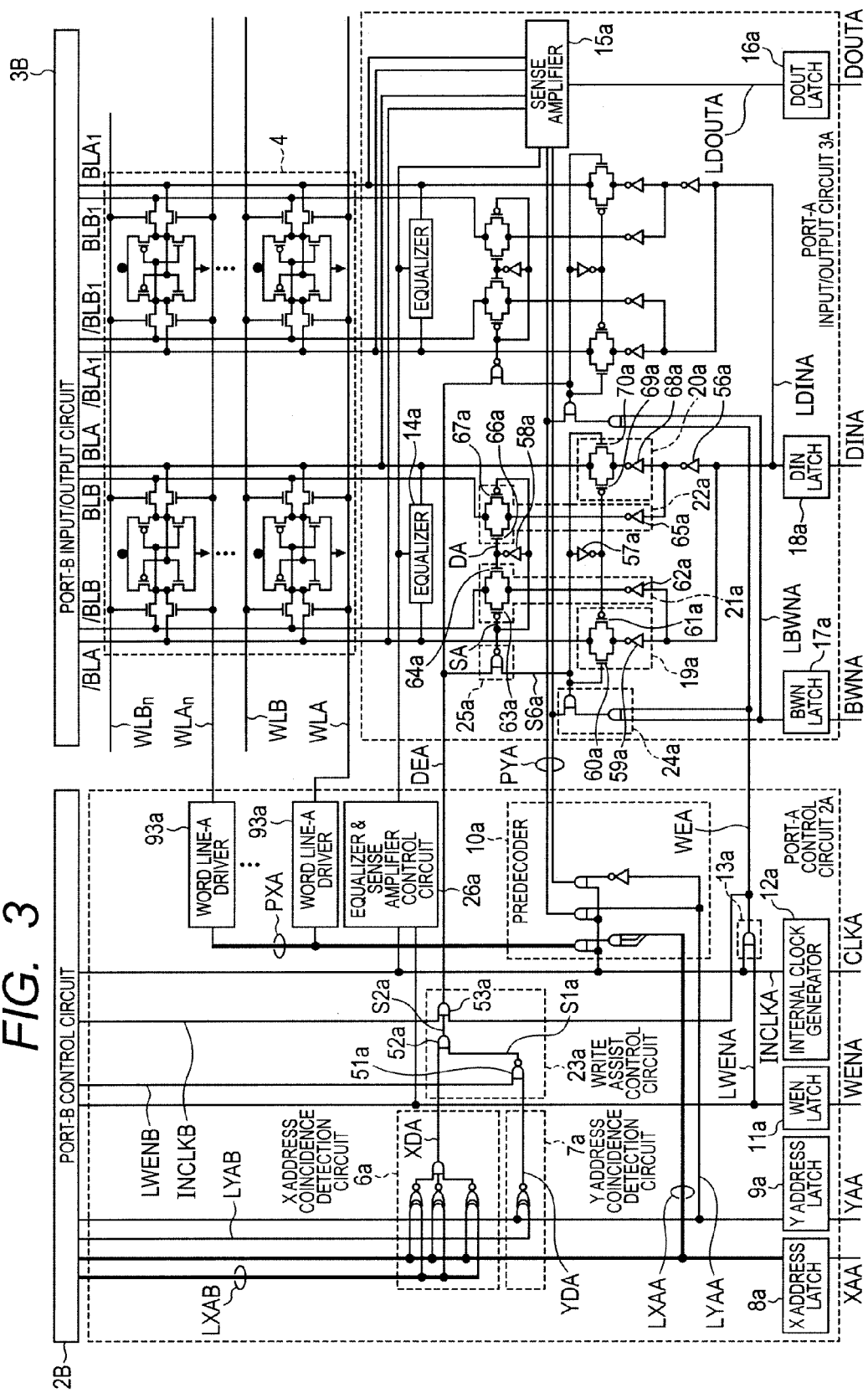
FIG. 3 is a drawing illustrating details of a port-A control circuit and a port-A input/output circuit illustrated in FIG. 1.

FIG. 3 illustrates details of the port-A control circuit and the port-A input/output circuit illustrated in FIG. 1.

As illustrated in FIG. 3, the port-A control circuit 2A comprises an X address latch 8a, a Y address latch 9a, a WEN latch 11a, an internal clock generator 12a, an X address coincidence detection circuit 6a, a Y address coincidence detection circuit 7a, a write assist control circuit 23a, a write controller 13a, a predecoder 10a, an equalizer & sense amplifier control circuit 26a, and a word line-A driver 93a.

The internal clock generator 12a receives a clock signal CLKA for access through the port A from the exterior, and generates an internal clock signal INCLKA which is activated for a predetermined period.

The X address latch 8a latches, based on the internal clock signal INCLKA, a row address signal XAA for specifying a row address inputted from the exterior and generates an internal row address signal LXAA.

The Y address latch 9a latches, based on the internal clock signal INCLKA, a column address signal YAA for specifying a column address inputted from the exterior and generates an internal column address signal LYAA.

The WEN latch 11a latches, based on the internal clock signal INCLKA, a read/write specification signal WENA for specifying whether access through the port A inputted from the exterior is a read or a write to the memory cell, and generates an internal read/write specification signal LWENA. The read/write specification signal WENA and the internal read/write specification signal LWENA are set to an "H" level when a write is specified, and set to an "L" level when a read is specified.

The write controller 13a generates a write enable signal WEA indicating a logical product of the internal read/write specification signal LWENA and the internal clock signal INCLKA. When a write is specified, the write enable signal WEA is set to an "H" level during a period when the internal clock signal INCLKA is at an "H" level.

The X address coincidence detection circuit 6a detects whether a row address specified by the internal row address signal LXAA coincides with a row address specified by the internal row address signal LXAB sent from the port-B control circuit 2B, and outputs a detection signal XDA indicating the detection result. When the detection result indicates a coincidence, the detection signal XDA is set to an "H" level, and when the detection result indicates a non-coincidence, the detection signal XDA is set to an "L" level.

In this way, the X address coincidence detection circuit 6a compares the internal row address signals LXAA and LXAB which have been latched based on the internal clock signals INCLKA and INCLKB, respectively. The internal row address signals do not change throughout the activated period (when the internal clock signal is at an "H" level). Therefore, the detection signal XDA is fixed during the period when both ports are activated (that is, the internal clock signals INCLKA and INCLKB are both at an "H" level); accordingly, even if both ports operate asynchronously, malfunction does not occur.

The Y address coincidence detection circuit 7a detects whether a column address specified by the internal column address signal LYAA coincides with a column address specified by the internal column address signal LYAB sent from the port-B control circuit 2B, and outputs a detection signal YDA indicating the detection result. When the detection result indicates a coincidence, the detection signal YDA is set to an "H" level, and when the detection result indicates a non-coincidence, the detection signal YDA is set to an "L" level.

In this way, the Y address coincidence detection circuit 7a compares the internal column address signals LYAA and LYAB which have been latched based on the internal clock signals INCLKA and INCLKB, respectively. The internal column address signals do not change throughout the activated period (when the internal clock signal is at an "H" level). Therefore, the detection signal YDA is fixed during the period when both ports are activated (that is, the internal clock signals INCLKA and INCLKB are both at an "H" level); accordingly, even if both ports operate asynchronously, malfunction does not occur.

The predecoder 10a predecodes the internal row address signal LXAA, and outputs a signal PXA indicating the predecoded result to the word line-A driver 93a. The predecoder 10a decodes the internal column address signal LYAA, and outputs a signal PYA indicating the column decoded result to the write driver control circuit 24a and the sense amplifier 15a.

In response to the signal PXA indicating the predecoded result from the predecoder 10a, the word line-A driver 93a activates a word line WLA corresponding to the decoded result among plural rows in the memory cell.

The equalizer & sense amplifier control circuit 26a controls equalizing timing of the equalizer 14a according to the internal clock signal INCLKA. The equalizer & sense amplifier control circuit 26a also controls timing of amplification of the sense amplifier 15a according to the internal clock signal INCLKA.

The write assist control circuit 23a comprises an NAND circuit 51a, a first AND circuit 52a, and a second AND circuit 53a.

The NAND circuit 51a receives the detection signal YDA from the Y address coincidence detection circuit 7a, and receives the internal read/write specification signal LWENB from the port-B control circuit 2B. The NAND circuit 51a sets a control signal S1a to an "L" level, only when the detection signal YDA is at an "H" level which indicates a coincidence of the column address and the internal read/write specification signal LWENB is at an "H" level which indicates a write, otherwise, the NAND circuit 51a sets the control signal S1a to an "H" level.

The first AND circuit 52a receives the control signal S1a and the detection signal XDA from the X address coincidence detection circuit 6a. The first AND circuit 52a sets a control signal S2a to an "H" level, only when the control signal S1a is at an "H" level and the detection signal XDA is at an "H" level which indicates a coincidence of the row address, otherwise, the first AND circuit 52a sets the control signal S2a to an "L" level.

The second AND circuit 53a receives the control signal S2a, the write enable signal WEA, and the internal clock signal INCLKB from the port-B control circuit 2B. The second AND circuit 53a sets a write assist control signal DEA to an "H" level, only when the control signal S2a is at an "H" level and the write enable signal WEA is at an "H" level and the internal clock signal INCLKB is at an "H" level, otherwise, the second AND circuit 53a sets the write assist control signal DEA to an "L" level.

Eventually, the write assist control circuit 23a activates the write assist control signal DEA to an "H" level, when the write enable signal WEA is at an "H" level, the internal clock signal INCLKB is at an "H" level, and the detection signal XDA is at an "H" level indicating a coincidence of the row address, and when the detection signal YDA is at an "L" level indicating a non-coincidence of the column address or the internal read/write specification signal LWENB is at an "L" level indicating a read.

The restriction to the condition that the write enable signal WEA is at an "H" level, the internal clock signal INCLKB is at an "H" level, and the detection signal XDA is at an "H" level indicating a coincidence of the row address is for avoiding a possible problem posed by erroneous writing which may occur in the case where writing is executed through the port A, when accesses are made to the same row in the port A and the port B and the access through the port B is activated.

The restriction to the condition that the detection signal YDA is at an "L" level indicating a non-coincidence of the column address or that the internal read/write specification signal LWENB is at an "L" level indicating a read is for preventing that writing is executed through both of the port A and the port B to the same memory cell (with the same column address and the same row address).

The port-A input/output circuit 3A comprises, for every column, an equalizer 14a, a sense amplifier 15a, a write driver control circuit 24a, write drivers 19a and 20a, a write assist driver control circuit 25a, write assist drivers 21a and 22a, inverters 56a, 57a, and 58a, a BWN latch 17a, a DIN latch 18a, and a DOUT latch 16a.

The DIN latch 18a latches the write data DINA in access through the port A inputted from the exterior, based on the internal clock signal INCLKA, and generates internal write data LDINA. The DIN latch 18a supplies the internal write data LDINA to the write driver 19a, the write assist driver 21a, and the inverter 56a. Accordingly, the same data is written to the bit line /BLA and the bit line /BLB; therefore, the bit line /BLA and the bit line /BLB can be set to the same potential.

The inverter 56a inverts the internal write data LDINA, and supplies it to the write driver 20a and the write assist driver 22a. Accordingly, the same data is written to the bit line BLA and the bit line BLB; therefore, the bit line BLA and the bit line BLB can be set to the same potential.

The BWN latch 17a latches the bit write mask signal BWNA specifying existence or nonexistence of a write mask for every column in access through the port A inputted from the exterior, based on the internal clock signal INCLKA, and generates an internal bit write mask signal LBWNA. The bit write mask signal BWNA and the internal bit write mask signal LBWNA are set to an "L" level when a write mask is specified.

The equalizer 14a sets the potential of the bit line BLA and the bit line /BLA to the same potential (VDD) at the timing specified by the equalizer & sense amplifier control circuit 26a (equalizing).

The sense amplifier 15a performs differential amplification of the potential of the bit line BLA and the bit line /BLA, when located in a column corresponding to the decoded result of a column of the predecoder 10a, and the sense amplifier 15a outputs the internal read data LDOUTA obtained by the differential amplification, to the DOUT latch 16a.

The DOUT latch 16a latches the internal read data LDOUTA in access through the port A outputted from the sense amplifier 15a, based on the internal clock signal INCLKA (latching is performed during the internal clock signal INCLKA is at an "L" level), and the DOUT latch 16a outputs the read data DOUTA.

The write driver control circuit 24a receives an internal bit write mask signal LBWNA, a write enable signal WEA, and a signal PYA indicating the column decoded result. The write driver control circuit 24a activates a write driver control signal S6a of its own column to an "H" level, when the internal bit write mask signal LBWNA is activated to an "H" level (no mask), the write enable signal WEA is activated to an "H" level, and the signal PYA indicating the column decoded result indicates its own column (namely, when its own column coincides with the column address specified by the column address signal YAA). The inverter 57a inverts write driver control signal S6a.

Activating the write driver control signal S6a when the write enable signal WEA is activated to an "H" level and when its own column coincides with the column address specified by the column address signal YAA is because it is necessary to perform a write to the bit lines BLA and /BLA of the column specified by the exterior, when the write is instructed from the exterior.

Activating the write driver control signal S6a when the internal bit write mask signal LBWNA indicates no mask is because prohibition of a write to the bit lines BLA and /BLA of the column is instructed from the exterior.

When activated, the write driver 19a applies voltage corresponding to the internal write data LDINA to the bit line /BLA. Specifically, the write driver 19a comprises an N-channel MOS transistor 60a, a P-channel MOS transistor 61a, and an inverter 59a. When the write driver control signal S6a is activated to an "H" level, the N-channel MOS transistor 60a and the P-channel MOS transistor 61a are set to ON, and the write driver 19a is activated. In this active state, the inverter 59a inverts the internal write data LDINA outputted from the DIN latch 18a. The inverted internal write data LDINA is outputted to the bit line /BLA via the N-channel MOS transistor 60a and the P-channel MOS transistor 61a.

When activated, the write driver 20a applies voltage corresponding to the inverted data of the internal write data LDINA to the bit line BLA. Specifically, the write driver 20a comprises an N-channel MOS transistor 70a, a P-channel MOS transistor 69a, and an inverter 68a. When the write driver control signal S6a is activated to an "H" level, the N-channel MOS transistor 70a and the P-channel MOS transistor 69a are set to ON, and the write driver 20a is activated. In this active state, the inverter 68a inverts further the inverted data of the internal write data LDINA outputted from the inverter 56a. Data after inverting twice the internal write data LDINA is outputted to the bit line BLA via the N-channel MOS transistor 70a and the P-channel MOS transistor 69a.

The write assist driver control circuit 25a activates the write assist driver control signal SA of its own column to an "L" level, when the write assist control signal DEA and the write driver control signal S6a of its own column are both activated to an "H" level. The inverter 58a inverts the write assist driver control signal SA, and activates the inverted write assist driver control signal DA to an "H" level.

In this way, when the write assist control signal DEA and the write driver control signal S6a of its own column are both activated, the write assist driver control signal SA and the inverted write assist driver control signal DA of its own column are activated. The present scheme is adopted to indicate, by the activation of the write assist control signal DEA, that a write assist is necessary to one of columns of the memory cell array 4, and to indicate, by the activation of the write driver control signal S6a, that a write is performed to one of the columns (that is, a write assist is necessary to the column).

When activated, the write assist driver 21a applies voltage corresponding to the internal write data LDINA to the bit line /BLB. Specifically, the write assist driver 21a comprises a P-channel MOS transistor 63a, an N-channel MOS transistor 64a, and an inverter 62a. When the write assist driver control signal SA is activated to an "L" level, the N-channel MOS transistor 64a and the P-channel MOS transistor 63a are set to ON, and the write assist driver 21a is activated. In this active state, the inverter 62a inverts the internal write data LDINA outputted from the DIN latch 18a. The inverted internal write data LDINA is outputted to the bit line /BLB via the N-channel MOS transistor 64a and the P-channel MOS transistor 63a.

When activated, the write assist driver 22a applies voltage corresponding to the internal write data LDINA to the bit line BLB. Specifically, the write assist driver 22a comprises a P-channel MOS transistor 67a, an N-channel MOS transistor 66a, and an inverter 65a. When the write assist driver control signal SA is activated to an "L" level, the N-channel MOS transistor 66a and the P-channel MOS transistor 67a are set to ON, and the write assist driver 22a is activated. In this active state, the inverter 65a inverts further the inverted data of the internal write data LDINA outputted from the inverter 56a. The data after inverting twice the internal write data LDINA is outputted to the bit line BLB via the N-channel MOS transistor 66a and the P-channel MOS transistor 67a.

(The port-B Control Circuit and the Port-B Input/Output Circuit)

Figure 4:
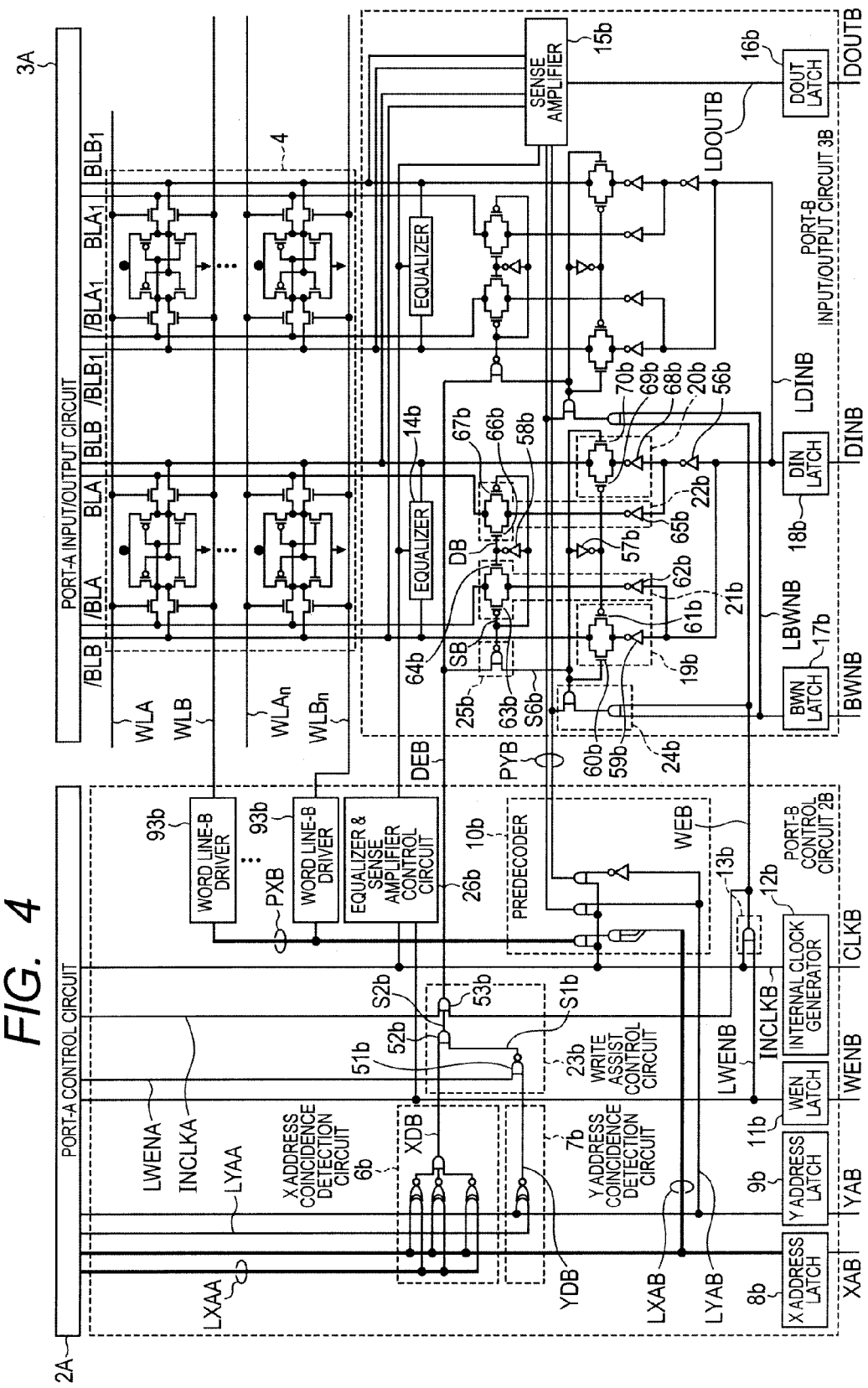
FIG. 4 is a drawing illustrating details of a port-B control circuit and a port-B input/output circuit illustrated in FIG. 1.

FIG. 4 illustrates details of the port-B control circuit and the port-B input/output circuit illustrated in FIG. 1.

As illustrated in FIG. 4, the port-B control circuit 2B comprises an X address latch 8b, a Y address latch 9b, a WEN latch 11b, an internal clock generator 12b, an X address coincidence detection circuit 6b, a Y address coincidence detection circuit 7b, a write assist control circuit 23b, a write controller 13b, a predecoder 10b, an equalizer & sense amplifier control circuit 26b, and a word line-B driver 93b.

The internal clock generator 12b generates an internal clock signal INCLKB which is activated for a predetermined period, in response to the clock signal CLKB for access through the port B from the exterior.

The X address latch 8b latches, based on the internal clock signal INCLKB, a row address signal XAB for specifying a row address inputted from the exterior, and generates an internal row address signal LXAB.

The Y address latch 9b latches, based on the internal clock signal INCLKB, a column address signal YAB for specifying a column address inputted from the exterior, and generates an internal column address signal LYAB.

The WEN latch 11b latches, based on the internal clock signal INCLKB, a read/write specification signal WENB for specifying whether access through the port B inputted from the exterior is a read or a write to the memory cell, and generates an internal read/write specification signal LWENB. The read/write specification signal WENB and the internal read/write specification signal LWENB are set to an "H" level when a write is specified, and set to an "L" level when a read is specified.

The write controller 13b generates a write enable signal WEB indicating a logical product of the internal read/write specification signal LWENB and the internal clock signal INCLKB. When a write is specified, the write enable signal WEB is set to an "H" level during a period when the internal clock signal INCLKB is at an "H" level.

The X address coincidence detection circuit 6b detects whether a row address specified by the internal row address signal LXAB coincides with a row address specified by the internal row address signal LXAA sent from the port-A control circuit 2A, and outputs a detection signal XDB indicating the detection result. When the detection result indicates a coincidence, the detection signal XDB is set to an "H" level, and when the detection result indicates a non-coincidence, the detection signal XDB is set to an "L" level.

In this way, the X address coincidence detection circuit 6b compares the internal row address signals LXAA and LXAB which have been latched based on the internal clock signals INCLKA and INCLKB, respectively. The internal row address signals do not change throughout the activated period (when the internal clock signal is at an "H" level). Therefore, the detection signal XDB is fixed during the period when both ports are activated (that is, the internal clock signals INCLKA and INCLKB are both at an "H" level); accordingly, even if both ports operate asynchronously, malfunction does not occur.

The Y address coincidence detection circuit 7b detects whether a column address specified by the internal column address signal LYAB coincides with a column address specified by the internal column address signal LYAA sent from the port-A control circuit 2A, and outputs a detection signal YDB indicating the detection result. When the detection result indicates a coincidence, the detection signal YDB is set to an "H" level, and when the detection result indicates a non-coincidence, the detection signal YDB is set to an "L" level.

In this way, the Y address coincidence detection circuit 7b compares the internal column address signals LYAA and LYAB which have been latched based on the internal clock signals INCLKA and INCLKB, respectively. The internal column address signals do not change throughout the activated period (when the internal clock signal is at an "H" level). Therefore, the detection signal YDB is fixed during the period when both ports are activated (that is, the internal clock signals INCLKA and INCLKB are both at an "H" level); accordingly, even if both ports operate asynchronously, malfunction does not occur.

The predecoder 10b predecodes the internal row address signal LXAB, and outputs a signal PXB indicating the predecoded result to the word line-B driver 93b. The predecoder 10b decodes the internal column address signal LYAB, and outputs a signal PYB indicating the column decoded result to the write driver control circuit 24b and the sense amplifier 15b.

In response to the signal PXB indicating the predecoded result from the predecoder 10b, the word line-B driver 93b activates a word line WLB corresponding to the decoded result among plural rows in the memory cell.

The equalizer & sense amplifier control circuit 26b controls equalizing timing of the equalizer 14b according to the internal clock signal INCLKB. The equalizer & sense amplifier control circuit 26b also controls timing of amplification of the sense amplifier 15b according to the internal clock signal INCLKB.

The write assist control circuit 23b comprises an NAND circuit 51b, a first AND circuit 52b, and a second AND circuit 53b.

The NAND circuit 51b receives the detection signal YDB from the Y address coincidence detection circuit 7b, and receives the internal read/write specification signal LWENA from the port-A control circuit 2A. The NAND circuit 51b sets the control signal S1b to an "L" level, only when the detection signal YDB is at an "H" level which indicates a coincidence of the column address and the internal read/write specification signal LWENA is at an "H" level which indicates a write, otherwise, the NAND circuit 51b sets the control signal S1b to an "H" level.

The first AND circuit 52b receives the control signal S1b and the detection signal XDB from the X address coincidence detection circuit 6b. The first AND circuit 52b sets the control signal S2b to an "H" level, only when the control signal S1b is at an "H" level and the detection signal XDB is at an "H" level which indicates a coincidence of the row address, otherwise, the first AND circuit 52b sets the control signal S2b to an "L" level.

The second AND circuit 53b receives a control signal S2b, a write enable signal WEB, and an internal clock signal INCLKA from the port-A control circuit 2A. The second AND circuit 53b sets a write assist control signal DEB to an "H" level, only when the control signal S2b is at an "H" level and the write enable signal WEB is at an "H" level and the internal clock signal INCLKA is at an "H" level, otherwise, the second AND circuit 53b sets the write assist control signal DEB to an "L" level.

Eventually, the write assist control circuit 23b activates the write assist control signal DEB to an "H" level, when the write enable signal WEB is at an "H" level, the internal clock signal INCLKA is at an "H" level, and the detection signal XDB is at an "H" level indicating a coincidence of the row address, and when the detection signal YDB is at an "L" level indicating a non-coincidence of the column address or the internal read/write specification signal LWENA is at an "L" level indicating a read.

The restriction to the condition that the write enable signal WEB is at an "H" level, the internal clock signal INCLKA is at an "H" level, and the detection signal XDB is at an "H" level indicating a coincidence of the row address is for avoiding a possible problem posed by erroneous writing which may occur in the case where writing is executed through the port B, when accesses are made to the same row in the port A and the port B and the access through the port A is activated.

The restriction to the condition that the detection signal YDB is at an "L" level indicating a non-coincidence of the column address or that the internal read/write specification signal LWENA is at an "L" level indicating a read is for preventing that writing is executed through both of the port A and the port B to the same memory cell (with the same column address and the same row address).

The port-B input/output circuit 3B comprises, for every column, an equalizer 14b, a sense amplifier 15b, a write driver control circuit 24b, write drivers 19b and 20b, a write assist driver control circuit 25b, write assist drivers 21b and 22b, inverters 56b, 57b, and 58b, a BWN latch 17b, a DIN latch 18b, and a DOUT latch 16b.

The DIN latch 18b latches the write data DINB in access through the port B inputted from the exterior, based on the internal clock signal INCLKB, and generates internal write data LDINB. The DIN latch 18b supplies the internal write data LDINB to the write driver 19b, the write assist driver 21b, and the inverter 56b. Accordingly, the same data is written to the bit line /BLA and the bit line /BLB; therefore, the bit line /BLA and the bit line /BLB can be set to the same potential.

The inverter 56b inverts the internal write data LDINB, and supplies it to the write driver 20b and the write assist driver 22b. Accordingly, the same data is written to the bit line BLA and the bit line BLB; therefore, the bit line BLA and the bit line BLB can be set to the same potential.

The BWN latch 17b latches the bit write mask signal BWNB specifying existence or nonexistence of a write mask for every column in access through the port B inputted from the exterior, based on the internal clock signal INCLKB, and generates an internal bit write mask signal LBWNB. The bit write mask signal BWNB and the internal bit write mask signal LBWNB are set to an "L" level when a write mask is specified.

The equalizer 14b sets the potential of the bit line BLB and the bit line /BLB to the same potential (VDD) at the timing specified by the equalizer & sense amplifier control circuit 26b (equalizing).

The sense amplifier 15b performs differential amplification of the potential of the bit line BLB and the bit line /BLB, when located in a column corresponding to the decoded result of a column of the predecoder 10b, and the sense amplifier 15b outputs the internal read data LDOUTB obtained by the differential amplification, to the DOUT latch 16b.

The DOUT latch 16b latches the internal read data LDOUTB in access through the port B outputted from the sense amplifier 15b, based on the internal clock signal INCLKB (latching is performed during the internal clock signal INCLKB is at an "L" level), and the DOUT latch 16b outputs the read data DOUTB.

The write driver control circuit 24b receives an internal bit write mask signal LBWNB, a write enable signal WEB, and a signal PYB indicating the column decoded result. The write driver control circuit 24b activates a write driver control signal S6b of its own column to an "H" level, when the internal bit write mask signal LBWNB is activated to an "H" level (no mask), the write enable signal WEB is activated to an "H" level, and the signal PYB indicating the column decoded result indicates its own column (namely, when its own column coincides with the column address specified by the column address signal YAB). The inverter 57b inverts write driver control signal S6b.

Activating the write driver control signal S6b when the write enable signal WEB is activated to an "H" level and when its own column coincides with the column address specified by the column address signal YAB is because it is necessary to perform a write to the bit lines BLB and /BLB of the column specified by the exterior, when the write is instructed from the exterior.

Activating the write driver control signal S6b when the internal bit write mask signal LBWNB indicates no mask is because prohibition of a write to the bit lines BLB and /BLB of the column is instructed from the exterior.

When activated, the write driver 19b applies voltage corresponding to the internal write data LDINB to the bit line /BLB. Specifically, the write driver 19b comprises an N-channel MOS transistor 60b, a P-channel MOS transistor 61b, and an inverter 59b. When the write driver control signal S6b is activated to an "H" level, the N-channel MOS transistor 60b and the P-channel MOS transistor 61b are set to ON, and the write driver 19b is activated. In this active state, the inverter 59b inverts the internal write data LDINB outputted from the DIN latch 18b. The inverted internal write data LDINB is outputted to the bit line /BLB via the N-channel MOS transistor 60b and the P-channel MOS transistor 61b.

When activated, the write driver 20b applies voltage corresponding to the inverted data of the internal write data LDINB to the bit line BLB. Specifically, the write driver 20b comprises an N-channel MOS transistor 70b, a P-channel MOS transistor 69b, and an inverter 68b. When the write driver control signal S6b is activated to an "H" level, the N-channel MOS transistor 70b and the P-channel MOS transistor 69b are set to ON, and the write driver 20b is activated. In this active state, the inverter 68b inverts further the inverted data of the internal write data LDINB outputted from the inverter 56b. Data after inverting twice the internal write data LDINB is outputted to the bit line BLB via the N-channel MOS transistor 70b and the P-channel MOS transistor 69b.

The write assist driver control circuit 25b activates the write assist driver control signal SB of its own column to an "L" level, when the write assist control signal DEB and the write driver control signal S6b of its own column are both activated to an "H" level. The inverter 58b inverts the write assist driver control signal SB, and activates the inverted write assist driver control signal DB to an "H" level.

In this way, when the write assist control signal DEB and the write driver control signal S6b of its own column are both activated, the write assist driver control signal SB and the inverted write assist driver control signal DB of its own column are activated. The present scheme is adopted to indicate, by the activation of the write assist control signal DEB, that a write assist is necessary to one of columns of the memory cell array 4, and to indicate, by the activation of the write driver control signal S6b, that a write is performed to one of the columns (that is, a write assist is necessary to the column).

When activated, the write assist driver 21b applies voltage corresponding to the internal write data LDINB to the bit line /BLA. Specifically, the write assist driver 21b comprises a P-channel MOS transistor 63b, an N-channel MOS transistor 64b, and an inverter 62b. When the write assist driver control signal SB is activated to an "L" level, the N-channel MOS transistor 64b and the P-channel MOS transistor 63b are set to ON, and the write assist driver 21b is activated. In this active state, the inverter 62b inverts the internal write data LDINB outputted from the DIN latch 18b. The inverted internal write data LDINB is outputted to the bit line /BLA via the N-channel MOS transistor 64b and the P-channel MOS transistor 63b.

When activated, the write assist driver 22b applies voltage corresponding to the internal write data LDINB to the bit line BLA. Specifically, the write assist driver 22b comprises a P-channel MOS transistor 67b, an N-channel MOS transistor 66b, and an inverter 65b. When the write assist driver control signal SB is activated to an "L" level, the N-channel MOS transistor 66b and the P-channel MOS transistor 67b are set to ON, and the write assist driver 22b is activated. In this active state, the inverter 65b inverts further the inverted data of the internal write data LDINB outputted from the inverter 56b. The data after inverting twice the internal write data LDINB is outputted to the bit line BLA via the N-channel MOS transistor 66b and the P-channel MOS transistor 67b.

(Operation)

Figure 5:
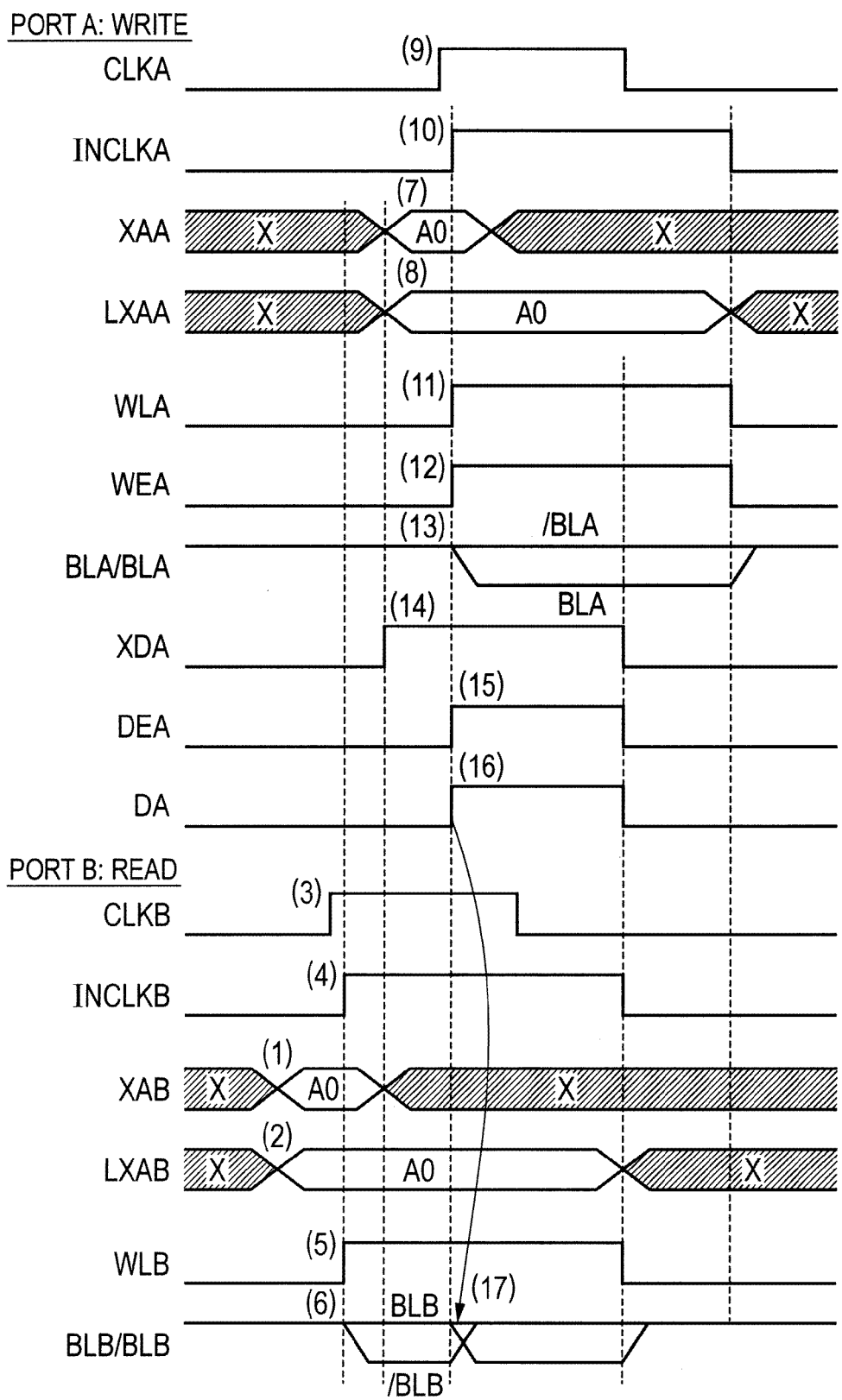
FIG. 5 is a timing chart of the semiconductor memory device according to the embodiment of the present invention.

FIG. 5 is a timing chart of the semiconductor memory device according to the embodiment of the present invention.

The timing chart of FIG. 5 illustrates operation at the time of a read/write to the same memory cell (a write through the port A and a read through the port B).

The following explains, first, operation in the case of performing a read through the port B (B1 and B2) and performing a write through the port A (A1 and A2) after some delay. It is assumed that data "1" (the memory node NA is at an "L" level and the memory node NB is at an "H" level) is stored in a memory cell of the accessing target.

First, a row address signal XAB (address A0) is inputted into the X address latch 8b of the port-B control circuit 2B (as shown in (1)).

Next, the X address latch 8b of the port-B control circuit 2B latches the row address signal XAB (address A0), and outputs an internal row address signal LXAB (as shown in (2)).

Next, the clock signal CLKB, which is inputted into the internal clock generator 12b of the port-B control circuit 2B, rises to an "H" level (as shown in (3)).

Next, the internal clock generator 12b of the port-B control circuit 2B detects a rising edge of the clock signal CLKB, and activates the internal clock signal INCLKB to an "H" level only for a predetermined period (as shown in (4)).

Next, the predecoder 10b and the word line-B driver 93b of the port-B control circuit 2B rise to an "H" level the word line WLB coupled to the ports B1 and B2 in the row corresponding to the internal row address signal LXAB (address A0) (as shown in (5)). The internal clock signal INCLKB is sent also to the write assist control circuit 23a of the port-A control circuit 2A. Accordingly, the write assist control circuit 23a of the port-A control circuit 2A can monitor the fact that the word line WLB coupled to the port B has risen to an "H" level.

Next, data "1" (the memory node NA is at an "L" level and the memory node NB is at an "H" level) stored in the memory cell coupled to the word line WLB is outputted to the bit-line pairs BLB and /BLB of the port B (B1 and B2). Accordingly, the bit line BLB is driven to an "H" level, and the bit line /BLB is driven to an "L" level (as shown in (6)).

Next, a row address signal XAA (address A0) is inputted into the X address latch 8*a* of the port-A control circuit 2A (as shown in (7)).

Next, the X address latch 8*a* of the port-A control circuit 2A latches the row address signal XAA (address A0), and outputs an internal row address signal LXAA (as shown in (8)).

Next, the clock signal CLKA, which is inputted into the internal clock generator 12*a* of the port-A control circuit 2A, rises to an "H" level (as shown in (9)).

Next, the internal clock generator 12*a* of the port-A control circuit 2A detects a rising edge of the clock signal CLKA, and activates the internal clock signal INCLKA to an "H" level only for a predetermined period (as shown in (10)).

Next, the predecoder 10*a* and the word line-A driver 93*a* of the port-A control circuit 2A rise to an "H" level the word line WLA coupled to the ports A1 and A2 in the row corresponding to the internal row address signal LXAA (address A0) (as shown in (11)).

Next, the read/write specification signal WENA ("H" level) which specifies a write is inputted into the WEN latch 11*a* from the exterior. The WEN latch 11*a* latches the read/write specification signal WENA based on the internal clock signal INCLKA, and generates an internal read/write specification signal LWENA ("H" level).

The write controller 13*a* of the port-A control circuit 2A generates a write enable signal WEA ("H" level) indicating a logical product of the internal read/write specification signal LWENA ("H" level) and the internal clock signal INCLKA (as shown in (12)).

Although not shown, the Y address latch 9*a* of the port-A control circuit 2A latches a column address signal YAA inputted at the same timing as the row address signal XAA, and outputs an internal column address signal LYAA. The predecoder 10*a* of the port-A control circuit 2A decodes the internal column address signal LYAA, and outputs a signal PYB ("H" level) indicating the column decoded result to the write driver control circuit 24*a* of the column specified by the decoded column address.

Although not shown, a bit write mask signal BWNA ("H" level: no mask) corresponding to the column specified by the decoded column address is inputted into the BWN latch 17*a* of the port-A input/output circuit 3A. The BWN latch 17*a* latches the bit write mask signal BWNA based on the internal clock signal INCLKA, and generates an internal bit write mask signal LBWNA ("H" level).

Next, the write driver control circuit 24*a* corresponding to the column specified by the column address decoded by the port-A input/output circuit 3A activates the write driver control signal S6*a* to an "H" level, upon receiving the signal PYB ("H" level), the write enable signal WEA ("H" level), and the internal bit write mask signal LBWNA ("H" level).

The DIN latch 18*a* latches, based on the internal clock signal INCLKA, the write data DINA ("L" level) inputted from the exterior, and generates an internal write data LDINA ("L" level). The DIN latch 18*a* supplies the internal write data LDINA to the write driver 19*a*, the write assist driver 21*a*, and the inverter 56*a*. The inverter 56*a* inverts the internal write data LDINA ("L" level), and supplies it to the write driver 20*a* and the write assist driver 22*a*.

Next, the write driver 19*a* corresponding to a column specified by the decoded column address in the port-A input/output circuit 3A is activated in response to the fact that the write driver control signal S6*a* has been activated to an "H" level, and outputs an "H" level to the bit line /BLA by inverting the logic of the internal write data LDINA ("L" level). The write driver 20*a* corresponding to a column specified by the decoded column address in the port-A input/output circuit 3A is activated in response to the fact that the write driver control signal S6*a* has been activated to an "H" level, and outputs an "L" level to the bit line BLA by further inverting the logic of the inverted data of the internal write data LDINA ("L" level) (as shown in (13)).

On the other hand, the X address coincidence detection circuit 6*a* of the port-A control circuit 2A activates the detection signal XDA to an "H" level, according to the fact that the row address indicated by the internal row address signal LXAA received from the X address latch 8*a* and the row address indicated by the internal row address signal LXAB received from the X address latch 8*b* in the port-B control circuit 2B coincide with each other (as shown in (14)).

The Y address coincidence detection circuit 7*a* of the port-A control circuit 2A activates the detection signal YDA to an "H" level, according to the fact that the column address indicated by the internal column address signal LYAA received from the Y address latch 9*a* and the column address indicated by the internal column address signal LYAB received from the Y address latch 9*b* in the port-B control circuit 2B coincide with each other.

The read/write specification signal WENB ("L" level) specifying a read is inputted into the WEN latch 11*b* of the port-B control circuit 2B, and the WEN latch 11*b* latches the read/write specification signal WENB based on the internal clock signal INCLKB and generates an internal read/write specification signal LWENB ("L" level).

The write assist control circuit 23*a* activates the write assist control signal DEA to an "H" level, upon receiving the internal clock signal INCLKB ("H" level), the write enable signal WEA ("H" level), the detection signal XDA ("H" level), the detection signal YDA ("H" level), and the internal read/write specification signal LWENB ("L" level) (as shown in (15)).

Next, the write assist driver control circuit 25*a* corresponding to the column specified by the decoded column address in the port-A input/output circuit 3A activates the write assist driver control signal SA to an "L" level, upon receiving the write driver control signal S6*a* ("H" level) from the write driver control circuit 24*a* and the write assist control signal DEA ("H" level) from the write assist control circuit 23*a*. The inverter 58A outputs an inverted write assist driver control signal DA ("H" level) obtained by inverting the write assist driver control signal SA (as shown in (16)).

Next, the write assist driver 21*a* corresponding to a column specified by the decoded column address in the port-A input/output circuit 3A is activated in response to the fact that the write assist driver control signal SA has been activated to an "H" level, and outputs an "H" level to the bit line /BLB by inverting the logic of the internal write data LDINA ("L" level).

Next, the write assist driver 22*a* corresponding to the column specified by the decoded column address in the port-A input/output circuit 3A is activated in response to the fact that the write assist driver control signal SA has been activated to an "H" level, and outputs an "L" level to the bit line BLB by further inverting the logic of the inverted data of the internal write data LDINA ("L" level) (as shown in (17)).

The operation exemplified above is a read and write operation in the completely same address (the same memory cell). However, even a read and write operation or a write and write operation in the case of the same row address but different column address, are essentially the same as described above, except that the operation of the port B changes from a read to a dummy read (the bit line is driven by the memory cell, however, the sense amplifier is not activated).

As described above, according to the embodiment of the present invention, when a write or a read is performed concurrently in the same address or the same row of the layout, interference from the port of the read side can be eliminated and an erroneous writing can be prevented, by making the bit line potential of a port of the read side the same as the bit line potential of a port of the write side. Consequently, it is possible to employ a memory cell with a small area although variation of transistors is large; accordingly it is possible to realize reduction of the chip area.

FIG. 3 and FIG. 4 illustrate the block diagrams in the case that the column address is expressed by one bit (that is, the degree of multiplexing is two). However, it is possible to easily realize a configuration with the degree of multiplexing greater than two, by changing the Y address coincidence detection circuit. It is also possible to easily realize a configuration with the degree of multiplexing of one. In this case, YDA and YDB will be fixed to an "H" level.

It should be understood by those skilled in the art that the embodiment disclosed in the present application is illustrative and not restrictive, with all the points of view. The scope of the present invention is illustrated not by the explanatory description given above but by the scope of the appended claims, and it is meant that various modifications, combinations, and alterations may occur depending on design requirements and other factors insofar as they are within the scope of the appended claims or the equivalents thereof.

What is claimed is:

1. A semiconductor memory device comprising:
a memory cell array with a plurality of memory cells arranged in a matrix and each having a first port and a second port;
a first bit line coupled to the first port;
a second bit line coupled to the second port;
a first write driver operable to apply voltage corresponding to first write data to the first bit line when activated; and
a first write assist driver operable to apply voltage corresponding to the first write data to the second bit line when activated,
wherein a row of the memory cell array for a first access is specified by a first row address through the first port,
wherein a row of the memory cell array for a second access is specified by a second row address through the second port, and
wherein the first write assist driver is activated at least on condition that the first write driver is activated and that the first row address is coincident with the second row address;
the semiconductor memory device further comprising:
a second write driver operable to apply voltage corresponding to second write data to the second bit line when activated; and
a second write assist driver operable to apply voltage corresponding to the second write data to the first bit line when activated,
wherein the second write assist driver is activated at least on condition that the second write driver is activated and that the first row address is coincident with the second row address;
the semiconductor device further comprising:
a first internal clock generator operable to generate a first internal clock signal which is activated for a predetermined period, in response to a first clock signal for the first access from the exterior;
a second internal clock generator operable to generate a second internal clock signal which is activated for a predetermined period, in response to a second clock signal for the second access from the exterior;
a first internal row address latch operable to latch, on the basis of the first internal clock signal, a signal for specifying a first row address inputted from the exterior, and operable to generate a first internal row address signal;
a second internal row address latch operable to latch, on the basis of the second internal clock signal, a signal for specifying a second row address inputted from the exterior, and operable to generate a second internal row address signal; and
a row address coincidence detection circuit operable to detect whether a row address specified by the first internal row address signal is coincident with a row address specified by the second internal row address signal.

2. The semiconductor memory device according to claim 1, further comprising:
a first read/write specification signal latch operable to latch, on the basis of the first internal clock signal, a first read/write specification signal for specifying whether the first access inputted from the exterior is a read or a write to the memory cell, and operable to generate a first internal read/write specification signal;
a second read/write specification signal latch operable to latch, on the basis of the second internal clock signal, a second read/write specification signal for specifying whether the second access inputted from the exterior is a read or a write to the memory cell, and operable to generate a second internal read/write specification signal;
a first write controller operable to generate a first write enable signal for activating the first write driver, on the basis of the first internal read/write specification signal and the first internal clock signal;
a second write controller operable to generate a second write enable signal for activating the second write driver, on the basis of the second internal read/write specification signal and the second internal clock signal;
a first write assist control circuit operable to activate a first write assist control signal for controlling the first write assist driver, when a coincidence is detected in the row address coincidence detection circuit and the second internal clock signal is activated and the first write enable signal is activated; and
a second write assist control circuit operable to activate a second write assist control signal for controlling the second write assist driver, when a coincidence is detected in the row address coincidence detection circuit and the first internal clock signal is activated and the second write enable signal is activated.

3. The semiconductor memory device according to claim 1, wherein a column of the memory cell array for the first access through the first port is specified by a first column address,
wherein a column of the memory cell array for the second access through the second port is specified by a second column address, and
wherein the semiconductor memory device further comprises
a first internal column address latch operable to latch, on the basis of the first internal clock signal, a signal for specifying the first column address inputted from the exterior, and operable to generate a first internal column address signal;

a second internal column address latch operable to latch, on the basis of the second internal clock signal, a signal for specifying the second column address inputted from the exterior, and operable to generate a second internal column address signal; and a column address coincidence detection circuit operable to detect whether a column address specified by the first internal column address signal is coincident with a column address specified by the second internal column address signal.

4. The semiconductor memory device according to claim 3, further comprising:

a first internal read/write specification signal latch operable to latch, on the basis of the first internal clock signal, a first read/write specification signal for specifying whether the first access inputted from the exterior is a read or a write to the memory cell, and operable to generate a first internal read/write specification signal;

a second internal read/write specification signal latch operable to latch, on the basis of the second internal clock signal, a second read/write specification signal for specifying whether the second access inputted from the exterior is a read or a write to the memory cell, and operable to generate a second internal read/write specification signal;

a first write controller operable to generate a first write enable signal for activating the first write driver, on the basis of the first internal read/write specification signal and the first internal clock signal;

a second write controller operable to generate a second write enable signal for activating the second write driver, on the basis of the second internal read/write specification signal and the second internal clock signal;

a first write assist control circuit operable to activate a first write assist control signal for controlling the first write assist driver, when a coincidence is detected in the row address coincidence detection circuit and the second internal clock signal is activated and the first write enable signal is activated, and when a non-coincidence is detected in the column address coincidence detection circuit or the second internal read/write specification signal specifies a read; and a second write assist control circuit operable to activate a second write assist control signal for controlling the second write assist driver, when a coincidence is detected in the row address coincidence detection circuit and the first internal clock signal is activated and the second write enable signal is activated, and when a non-coincidence is detected in the column address coincidence detection circuit or the first internal read/write specification signal specifies a read.

5. The semiconductor memory device according to claim 1, further comprising:

a first input data latch operable to latch, on the basis of the first internal clock signal, the first write data in the first access inputted from the exterior, and operable to generate first internal write data; and a second input data latch operable to latch, on the basis of the second internal clock signal, the second write data in the second access inputted from the exterior, and operable to generate second internal write data, wherein the first input data latch supplies the first internal write data to the first write driver and the first write assist driver, and wherein the second input data latch supplies the second internal write data to the second write driver and the second write assist driver.

6. The semiconductor memory device according to claim 2 or claim 4, wherein the first write driver, the second write driver, the first write assist driver, and the second write assist driver are provided for every column, wherein the semiconductor memory device further comprises:

a first write driver control circuit provided for every column;

a first write assist driver control circuit provided for every column;

a second write driver control circuit provided for every column; and a second write assist driver control circuit provided for every column, wherein the first write driver control circuit activates the first write driver of its own column by activating a first write driver control signal of its own column, when the first column address is coincident with the address of its own column and when the first write enable signal is activated, wherein the first write assist driver control circuit activates the first write assist driver of its own column by activating a first write assist driver control signal of its own column, when the first write assist control signal and the first write driver control signal of its own column are both activated, wherein the second write driver control circuit activates the second write driver of its own column by activating a second write driver control signal of its own column, when the second column address is coincident with the address of its own column and when the second write enable signal is activated, and wherein the second write assist driver control circuit activates the second write assist driver of its own column by activating a second write assist driver control signal of its own column, when the second write assist control signal and the second write driver control signal of its own column are both activated.

7. The semiconductor memory device according to claim 2 or claim 4, wherein the first write driver, the second write driver, the first write assist driver, and the second write assist driver are provided for every column, wherein the semiconductor memory device further comprises:

a first bit mask signal latch operable to latch, on the basis of the first internal clock signal, a first bit write mask signal inputted from the exterior to specify existence or non-existence of a write mask for every column in the first access, and operable to generate a first internal bit write mask signal;

a second bit mask signal latch operable to latch, on the basis of the second internal clock signal, a second bit write mask signal inputted from the exterior to specify existence or nonexistence of a write mask for every column in the second access, and operable to generate a second internal bit write mask signal;

a first write driver control circuit provided for every column;

a first write assist driver control circuit provided for every column;

a second write driver control circuit provided for every column; and a second write assist driver control circuit provided for every column, wherein the first write driver control circuit activates the first write driver of its own column by activating a first write driver control signal of its own column, when the first column address is coincident with the address of its own column and the first internal bit write mask signal indicates no write mask and the first write enable signal is activated, wherein the first write assist driver control circuit activates the first write assist driver of its own column by activating a first write assist driver control signal of its own column, when the first write assist control signal and the first write driver control signal of its own column are both activated, wherein the second write driver control circuit activates the second write driver of its own column by activating a second write driver control signal of its own column, when the second column address is coincident with the address of its own column and the second internal bit write mask signal indicates no write mask and the second write enable signal is activated, and wherein the second write assist driver control circuit activates the second write assist driver of its own column by activating a second write assist driver control signal of its own column, when the second write assist control signal and the second write driver control signal of its own column are both activated.

8. The semiconductor memory device according to claim 1, wherein the memory cell is an SRAM cell.

* * * * *